United States Patent

Tsuji

[11] Patent Number: 5,881,054
[45] Date of Patent: Mar. 9, 1999

[54] FREQUENCY DIVISION DUPLEX TRANSMITTER WHICH ATTENUATES THE DIFFERENCE BETWEEN A RECEIVING FREQUENCY AN OUTPUT FREQUENCY FROM A SECOND OSCILLATOR

[75] Inventor: Kazushi Tsuji, Tokyo, Japan

[73] Assignee: NEC Corporation, Tokyo, Japan

[21] Appl. No.: 653,247

[22] Filed: May 24, 1996

[30] Foreign Application Priority Data

May 25, 1995 [JP] Japan ..................................... 7-126487

[51] Int. Cl.[6] ................................ H04J 1/00; H04B 1/40
[52] U.S. Cl. ................................ 370/281; 455/91; 455/24
[58] Field of Search ................................ 370/281, 294; 455/24, 22, 83, 91, 75, 76, 112, 113, 114, 118, 255, 296

[56] References Cited

U.S. PATENT DOCUMENTS 5,475,677  12/1995  Arnold ................................ 370/281

FOREIGN PATENT DOCUMENTS 1-174018  7/1989  Japan .

Primary Examiner—Douglas W. Olms
Assistant Examiner—David R Vincent
Attorney, Agent, or Firm—Foley & Lardner

[57] ABSTRACT

Intermediate frequency Fif output from a first frequency mixer passes through IF filter which attenuates a noise level at a frequency of a difference between receiving frequency Frx and output frequency FL2 from a second local oscillator to a level such that the a transmitting noise produces no receiving sensitivity suppression, whereby the intermediate frequency becomes one that possesses a sufficiently low noise level compared to a sensitivity level of a receiver. After the intermediated frequency is converted to a transmitting frequency by a second frequency mixer, in the intermediate frequency which increases its noise level by a gain obtained by the circuit components disposed behind first frequency mixer, a receiving band noise is removed by a transmitting filter having an attenuation amount at a receiving band equal to the gain obtained by the circuit component disposed behind the first frequency mixer.

4 Claims, 4 Drawing Sheets

FREQUENCY DIVISION DUPLEX TRANSMITTER WHICH ATTENUATES THE DIFFERENCE BETWEEN A RECEIVING FREQUENCY AN OUTPUT FREQUENCY FROM A SECOND OSCILLATOR

BACKGROUND OF THE INVENTION

1. Field of the Invention

The present invention relates to a transmitter, more particularly to a transmitter employing an FDD (Frequency Division Duplex) system.

2. Description of the Prior Art

FIG. 1 is a block diagram showing a conventional transmitter disclosed in Japanese Patent Laid Open No. 174018/89.

The transmitter shown in FIG. 1 consists of a radio transmitter-receiver and a transmitter-receiver detouring wave canceling circuit. The radio transmitter-receiver comprises transmitting signal input terminal 21, transmitting IF amplifier 22, transmitting frequency mixer 23, transmitting filter 24, transmitting power amplifier 25, local oscillator 26, distributer 27, transmitter-receiver commonly-used device 28, antenna connecting terminal 29, receiving filter 30, receiving high-frequency amplifier 31, receiving frequency mixer 32, receiving IF filter 33, receiving IF band amplifier 34, and receiving signal output terminal 35. The transmitter-receiver detouring wave cancel circuit comprises directional coupling device 36, adjusting device 37, directional coupling device 38, transmitting filter 39, detector 40, and control section 41.

Transmitting waves are partially branched by directional connection device 36 disposed in a transmitting side, and the branched waves are output to directional coupling device 38 disposed in a receiving side via adjusting device 37. Hereupon, adjusting device 37 adjusts the amplitude and the phase of the transmitting waves output from directional coupling device 36 so that the amplitude of the transmitting waves is the same as that of the transmitter-receiver detouring waves and the phase of the transmitting waves shifts from that of the transmitter-receiver detouring waves by 180 degrees. The transmitter-receiver detouring waves are output to directional coupling device 38 after passing through transmitter-receiver commonly-used device 28. Directional coupling device 38 disposed in the receiving side synthesizes the waves output from adjusting device 37 with the transmitter-receiver detouring waves which detours around adjusting device 37 by passing through transmitter-receiver commonly-used device 28. As a result, the transmitter-receiver detouring waves are canceled.

The foregoing conventional transmitter has heretofore employed the technique in which the amplitude and the phase of the signal obtained by separating the transmitting output are adjusted and then the signal is synthesized with the receiving input. However, this technique requires directional coupling devices both for the transmitting and receiving sides so that transmitting loss is brought about and a power amplification efficiency is made worse in the coupling device of the transmitting side. On the other hand, in the coupling device of the receiving side, a receiving signal is attenuated, and a receiving sensitivity is deteriorated. Furthermore, it is required to detect transmitting noises included in a receiving IF band and to adjust the amplitude and phase of the branched transmitting signal with a high precision. Hence, there is a problem that the circuit constitution is complicated.

SUMMARY OF THE INVENTION

The object of the present invention is to provide a transmitter employing an FDD system which is capable of reducing receiving band noises included in an output to obtain a transmitting wave C/N (carrier to Noise ratio) which produces no receiving sensitivity suppression.

According to the present invention, a transmitter employing an FDD system is provided, which comprises:

first local oscillation means;

first frequency mixer means for receiving a base band modulation signal and an output from the first local oscillation means and for converting the base band modulation signal to an intermediate frequency;

IF filter means for attenuating the intermediate frequency;

second local oscillation means;

second frequency mixer means for receiving the intermediate frequency passing through the IF filter means and an output from the second local oscillation means and for converting the intermediate frequency to a transmitting frequency;

power amplifier means for amplifying the transmitting frequency; and transmitting filter means with a pass band for allowing the transmitting frequency to pass and for attenuating a frequency in a receiving band, the transmitting filter means being connected to an output terminal of the power amplifier means, wherein the IF filter means attenuates a frequency of the difference between a receiving frequency and an output frequency from the second local oscillation means so that a noise level at the frequency of the difference becomes a level that a transmitting noise produces no receiving sensitivity suppression.

The intermediate frequency output from the first frequency mixer means passes through the IF filter means which attenuates the noise level at the frequency of the difference between the receiving frequency and the output frequency from the second local oscillation means to the level such that the transmitting noise produces no receiving sensitivity suppression, whereby the intermediate frequency becomes one that possesses a sufficiently low noise level compared to a sensitivity level of a receiver. The intermediate frequency increases its noise level by a gain obtained by the circuit components disposed behind the first frequency mixer means. After the intermediate frequency is converted to a transmitting frequency by the second frequency mixer means, a receiving band noise is removed by the transmitting filter means having an attenuation amount at a receiving band equal to the gain obtained by the circuit components downstream of the IF filter. Thus, a transmitting wave of the same noise level as that of an output from the IF filter, that is, a C/N transmitting wave which produces no receiving sensitivity suppression can be obtained at a transmitting output terminal.

As described above, the filter having such characteristic that an attenuation band is the frequency of the difference between a receiving frequency and the output frequency from the second local oscillation means is inserted in an intermediate frequency band whereby the intermediate frequency noises are canceled. Therefore, the coupling devices in the transmitting and receiving sides and the amplitude phase control circuit, which has been heretofore needed, are not required in the present invention so that the circuit constitution is simplified. Thus, a small-sized transmitter can be constituted. Since the coupling device in the receiving side is not needed, a sensitivity deterioration due to the coupling device is not produced. Since the coupling device in the receiving side is not needed and, moreover, the attenuation amount of the receiving band of the transmitting filter means suffices to be a gain obtained by the circuit components disposed behind the first frequency mixer means, the small-sized transmitting filter means can be used with a low loss. Furthermore, this effect increases power amplification efficiency and produces a lower power consumption of the transmitter. In addition, a frequency in the intermediate frequency band of the transmitter is low compared to the transmitting frequency band so that a ratio of a pass frequency to an attenuation frequency is large. Since the pass power is small, a narrow band filter such as a small-sized and inexpensive SAW (Surface Acoustic Wave) filter can be used as the IF filter means. Therefore, a sufficient attenuation amount can be practically obtained.

The above and other objects, features, and advantages of the present invention will become apparent from the following description with reference to the accompanying drawings which illustrate examples of the present invention.

DESCRIPTION OF A PREFERRED EMBODIMENT

Figure 1:
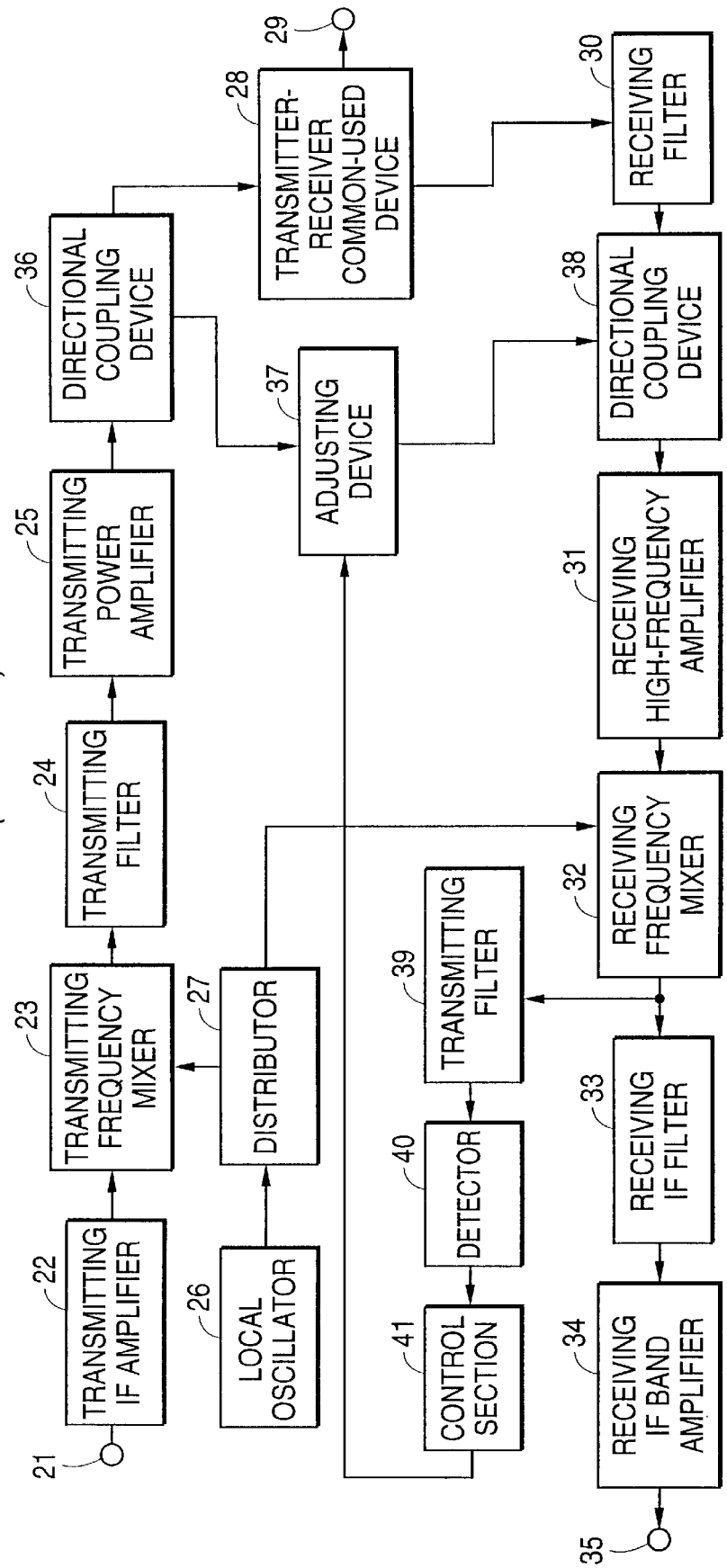
FIG. 1 is a block diagram of a conventional transmitter employing an FDD system.
Figure 2:
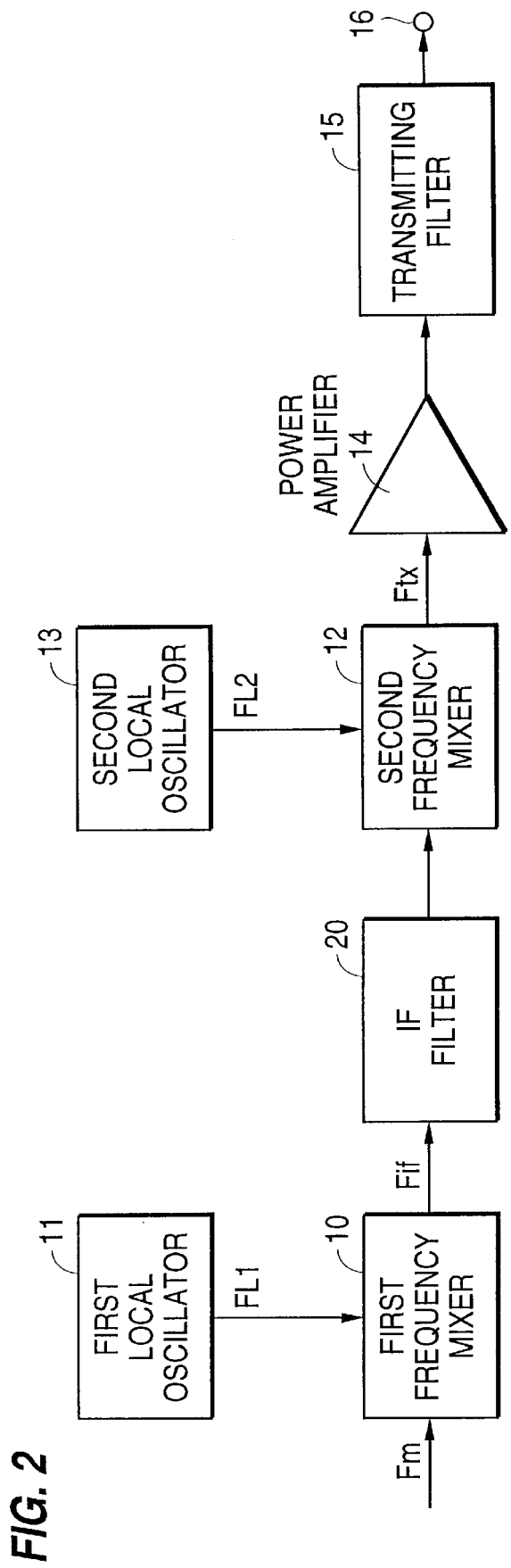
FIG. 2 is a block diagram of a transmitter employing an FDD system according to an embodiment of the present invention.

Referring to FIG. 2, a transmitter employing an FDD system according to an embodiment of the present invention is composed of first frequency mixer 10, first local oscillator 11, second frequency mixer 12, second local oscillator 13, power amplifier 14, transmitting filter 15, transmitting output terminal 16, and IF filter 20.

First frequency mixer 10 receives base band modulation signal Fm and output FL1 from first local oscillator 11 and outputs intermediate frequency Fif. IF filter 20 is inserted between first frequency mixer 10 and second frequency mixer 12 to obtain a C/N transmitting frequency which produces no receiving sensitivity suppression. Second frequency mixer 12 receives intermediate frequency Fif and output FL2 from second local oscillator 13 and outputs transmitting frequency Ftx. Amplifier 14 serves to amplify transmitting frequency Ftx, and transmitting filter 15 serves to attenuate receiving frequency noises. Transmitting output terminal 16 is connected either to an antenna multicoupler (not shown) or to an antenna (not shown).

Figure 3:
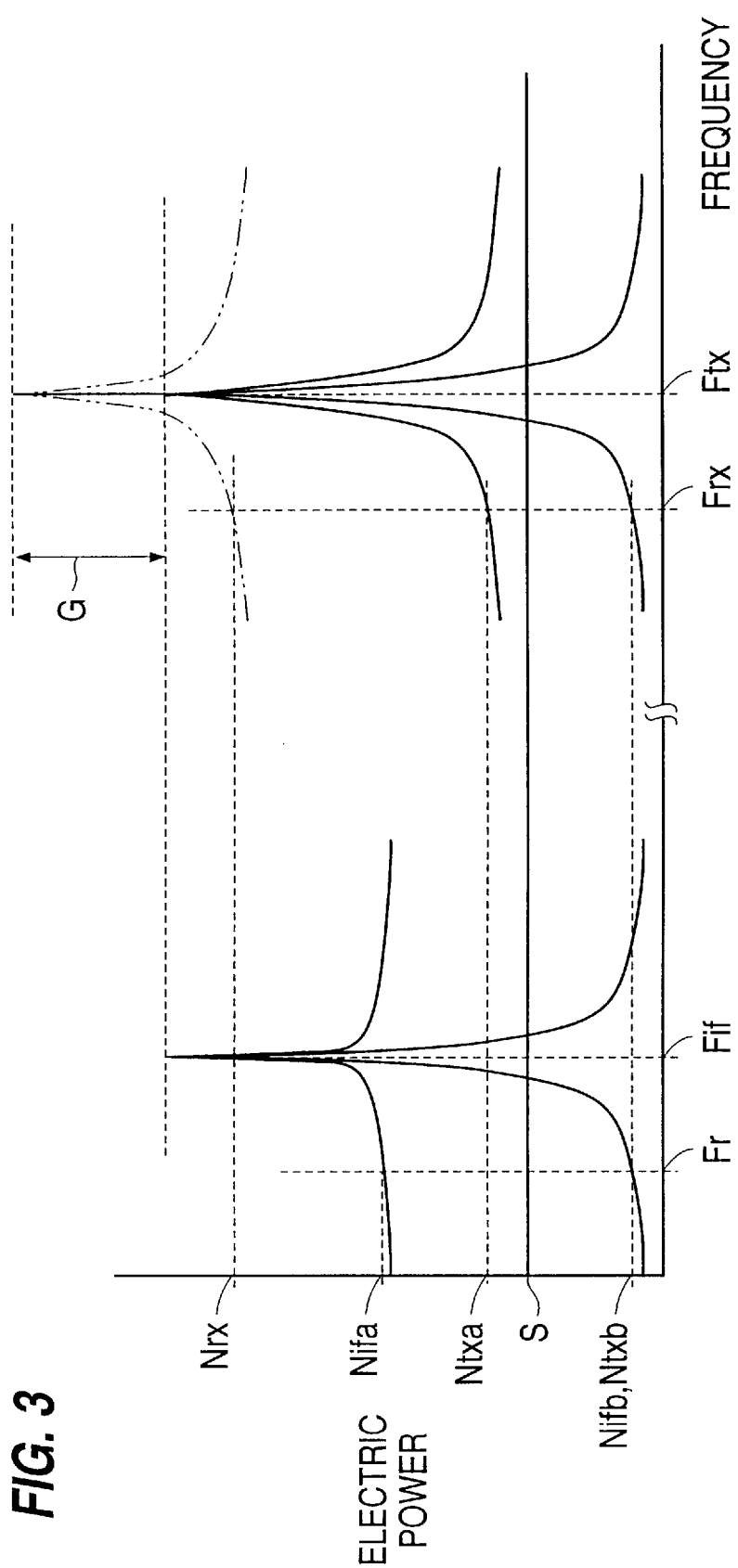
FIG. 3 is a diagram showing a spectrum distribution in each portion of the block diagram of the transmitter in FIG. 2.
Figure 4:
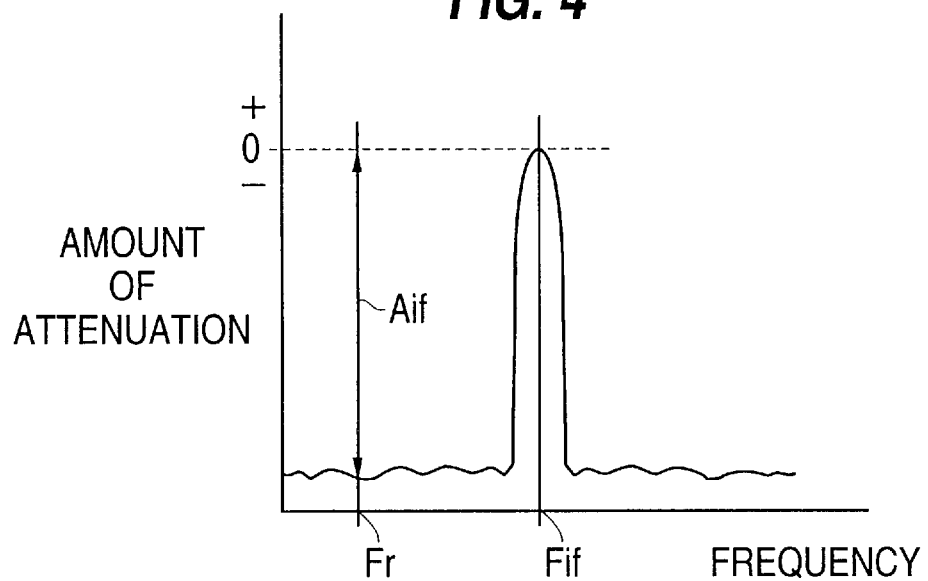
FIG. 4 is a diagram showing a frequency characteristic of an IF filter in the embodiment of FIG. 2.
Figure 5:
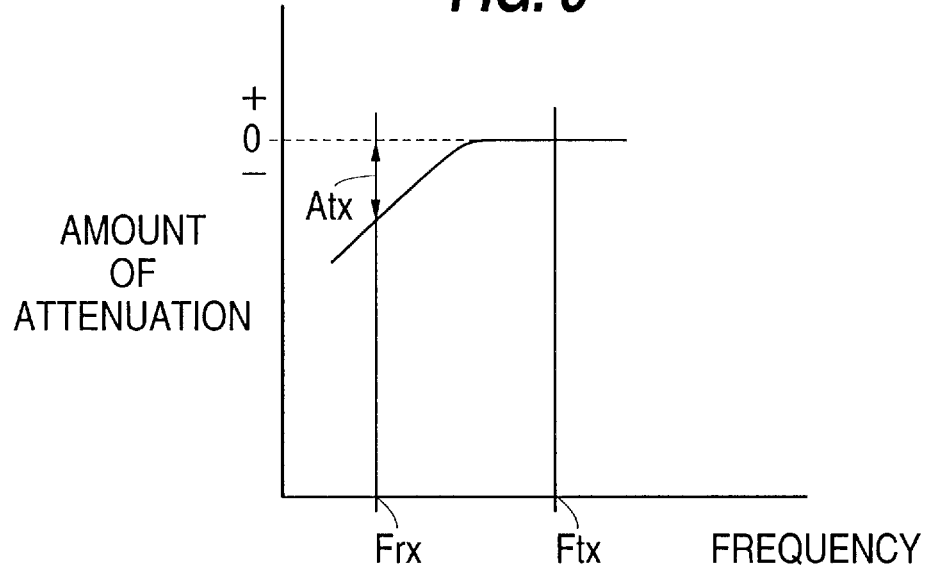
FIG. 5 is a diagram showing a frequency characteristic of a transmitting filter in the embodiment of FIG. 2.

Next, an operation of the transmitter of this embodiment will be described. When a transmitting operation is done, base band modulation signal Fm is converted to intermediate frequency Fif by output FL1 from first local oscillator 11 and first frequency mixer 10. Further, intermediate frequency Fif passes through IF filter 20 and is converted to transmitting frequency Ftx by output FL2 from second local oscillator 13 and second frequency mixer 12. Transmitting frequency Ftx is amplified by power amplifier 14 and is output to transmitting terminal 16 via transmitting filter 15. As shown in FIG. 3 concerning an output spectrum of the first frequency mixer 10, however, noise level Nifa is present in the intermediate frequency band. When a noise component corresponding to intermediate frequency Fif with respect to this noise level Nifa is directly converted to a transmitting wave by second frequency mixer 12, the noise level of a receiving frequency band is rendered Nrx, whereby transmitting wave C/N is made worse resulting in producing sensitivity suppression of the receiver. For this reason, in this embodiment, the attenuation amount Aif of IF filter 20 is set to one such that a noise level at a frequency shown in FIG. 4, that is, a frequency of a difference between receiving frequency Frx and output frequency FL2 of second local oscillator 13 becomes a level in which a transmitting wave noise produces no receiving sensitivity suppression, that is, for example, a sufficient low level compared to a sensitivity level of a receiver as a kTB level. Thus, sufficient low noise level Nifb compared to sensitivity level S of the receiver shown in FIG. 3 can be obtained. Hereupon, in a transmitter-receiver of a 1.9 GHz mobile communication base, a receiving frequency band, for example, when receiving frequency band Frx is set to 1890 to 1910 MHz; transmitting frequency band Ftx, 1970 to 1990 MHz; second local oscillator output FL2, 1710.75 to 1730.75 MHz; and occupied band width, 384 KHZ, frequency pass band of IF filter 20 is 259.25±384 MHz; attenuation frequency, 179.25±384 MHz. The output from IF filter 20 is subjected to a frequency conversion by second frequency mixer 12, and, further, is amplified by power amplifier 14. Then, it is input to transmitting filter 15. Noise level Ntxa at this time increases by gain G obtained by the circuit components disposed behind the first frequency mixer 10 as shown in FIG. 3. The attenuation amount Arf in the transmitting band of transmitting filter 15 shown in FIG. 5 is set equal to gain G obtained by the circuit components disposed behind the first frequency mixer 10 whereby the increased noise level can be canceled. Therefore, noise level Ntxb at transmitting output terminal 16 is rendered equal to noise level Nifb at the output terminal of IF filter 20 so that the transmitting wave C/N which produces no receiving sensitivity suppression can be obtained.

While a preferred embodiment of the present invention has been described using specific terms, such description is for illustrative purposes only, and it is to be understood that changes and variations may be made without departing from the spirit or scope of the following claims.

What is claimed is:

1. A transmitter employing an FDD system comprising:
   a first local oscillator;
   a first frequency mixer for receiving a base band modulation signal and an output from said first local oscillator and for converting said base band modulation signal to an intermediate frequency;
   an IF filter for attenuating said intermediate frequency;
   a second local oscillator;
   a second frequency mixer for receiving said intermediate frequency passing through said IF filter and an output from said second local oscillator and for converting said intermediated frequency to a transmitting frequency;
   a power amplifier for amplifying said transmitting frequency; and
   a transmitting filter with a pass band for allowing said transmitting frequency to pass, said transmitting filter being connected to an output terminal of said power amplifier,
   wherein said IF filter includes means for attenuating the difference between a receiving frequency and an output frequency from said second local oscillator so that a transmitting noise at the difference frequency produces no receiving sensitivity suppression.

2. The transmitter according to claim 1, wherein said transmitting filter attenuates a frequency in a transmitting band of said transmitting filter by an amount substantially equal to a gain obtained downstream of said IF filter.

3. A method of reducing noise in a FDD system:
   a) providing a first local oscillator signal from a first local oscillator;
   b) converting a base band modulated signal to an intermediate frequency (IF) signal by mixing said base band modulated signal with said first local oscillator signal from said first local oscillator;
   c) attenuating said IF signal;
   d) providing a second local oscillator signal from a second local oscillator;
   e) converting said IF signal to a transmitting frequency signal by mixing said attenuated IF signal with said second local oscillator signal from said second local oscillator;
   f) amplifying said transmitting frequency signal;
   g) filtering said amplified transmitting frequency signal in a band pass sufficient to pass said amplified frequency signal;
   h) said step of attenuating said IF signal including attenuating at a frequency equal to the difference between a receiving frequency and the frequency of said second local oscillator signal so that a transmitting noise at said difference frequency produces no receiving sensitivity suppression.

4. A method as recited in claim 3 further comprising the step of:

attenuating said amplified transmitting frequency signal by an amount substantially equal to a gain obtained in steps e) and f).

* * * * *